United States Patent
Ha et al.

(10) Patent No.: US 7,733,710 B2
(45) Date of Patent: Jun. 8, 2010

(54) MEASURING HIGH VOLTAGES IN AN INTEGRATED CIRCUIT USING A COMMON MEASUREMENT PAD

(75) Inventors: Hyun-chul Ha, Gyeonggi-do (KR); Oh-suk Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 12/190,208

(22) Filed: Aug. 12, 2008

(65) Prior Publication Data

US 2009/0085646 A1 Apr. 2, 2009

(30) Foreign Application Priority Data

Sep. 28, 2007 (KR) ...................... 10-2007-0098404

(51) Int. Cl.
*G11C 5/14* (2006.01)
(52) U.S. Cl. .................... 365/189.09; 365/226; 365/201
(58) Field of Classification Search ............ 365/189.07, 365/189.08, 185.09, 185.23, 201, 226; 327/536–537
See application file for complete search history.

(56) References Cited

U.S. PATENT DOCUMENTS

| | | | |
|---|---|---|---|
| 6,654,290 B2 * | 11/2003 | Lee et al. ................ | 365/185.23 |
| 7,298,157 B2 | 11/2007 | Kim | |
| 7,440,346 B2 * | 10/2008 | Won ........................... | 365/201 |
| 7,602,664 B2 * | 10/2009 | Kang ......................... | 365/226 |
| 7,646,230 B2 * | 1/2010 | Parfitt ........................ | 327/265 |
| 2006/0120154 A1 | 6/2006 | Lee | |

FOREIGN PATENT DOCUMENTS

| KR | 2002-0057687 A | 7/2002 |
|---|---|---|
| KR | 10-2004-0084400 A | 10/2004 |
| KR | 10-2005-0050708 A | 6/2005 |
| KR | 10-2006-0006589 A | 1/2006 |

* cited by examiner

*Primary Examiner*—Gene N. Auduong
(74) *Attorney, Agent, or Firm*—Myers Bigel Sibley & Sajovec, P.A.

(57) ABSTRACT

Integrated circuit devices include operational circuits that are configured to operate from power supply voltages and from high voltages that are generated in the integrated circuit device from the power supply voltages. A circuit for measuring the high voltages is also provided in the integrated circuit. The circuit includes a common high voltage measurement pad and high voltage switch units connected to the common high voltage measurement pad. A respective high voltage switch unit is configured to transmit a corresponding one of the high voltages to the common high voltage measurement pad in response to a corresponding enable signal. The operational circuits may be non-volatile memory cells, such as flash memory cells. Related methods of measuring high voltages in an integrated circuit device are also described.

20 Claims, 15 Drawing Sheets

MEASURING HIGH VOLTAGES IN AN INTEGRATED CIRCUIT USING A COMMON MEASUREMENT PAD

CROSS-REFERENCE TO RELATED APPLICATION

This application claims priority under 35 U.S.C. §119 of Korean Patent Application No. 10-2007-0098404, filed on Sep. 28, 2007, the disclosure of which is hereby incorporated herein by reference in its entirety as if set forth fully herein.

FIELD OF THE INVENTION

The present invention relates to integrated circuit (semiconductor) devices, such as non-volatile memory devices, and, more particularly, to circuits and methods for measuring high voltages of various levels in the integrated circuit.

BACKGROUND OF THE INVENTION

Flash memory devices are widely used non-volatile memory devices that can electrically erase or rewrite data. Flash memory devices may consume less power than magnetic disc memory-based storage media and may have a fast access time like hard discs.

Flash memory devices may be classified into NOR flash memory devices and NAND flash memory devices according to a connection structure of cells and bit lines. NOR flash memory devices generally have one bit line and two or more cell transistors connected in parallel, store data by using a channel hot electron method, and erase data by using a Fowler-Nordheim (F-N) method. NAND flash memory devices generally have one bit line and two or more cell transistors connected in series, and store and erase data by using an F-N tunneling method. In general, NOR flash memory devices may have relatively high current consumption, but may have an advantage of high speed operation. NAND flash memory devices may allow high integration because of generally lower cell current consumption than NOR flash memory devices.

FIG. 1 is a cross-sectional view illustrating a conventional unit cell of a flash memory device.

Referring to FIG. 1, the flash memory device stores data in an array of floating gate transistors called cells. In detail, the flash memory device may include a p-type semiconductor substrate 11 doped with boron ions or the like. An n-type source region 12 and an n-type drain region 13 may be formed by doping phosphorus, arsenic, antimony and/or the like into the substrate 11. A floating gate 14 may be formed over the substrate 11, and may be isolated from the substrate 11. A control gate 15 may be formed over the floating gate 14, and may be isolated from the floating gate 14. Since the floating gate 14 is isolated, charges stored in the floating gate 14 are trapped and data can be retained in the floating gate 14 without significant power consumption.

FIG. 2A is a circuit diagram illustrating memory cells included in a conventional NAND flash memory device.

Referring to FIG. 2A, the conventional NAND flash memory device includes a plurality of word lines WL11 through WL14 and a plurality of memory cells M11 through M14. The memory cells M11 through M14 form a string structure together with select transistors ST1 and ST2 and are connected in series between a bit line BL and a ground voltage terminal VSS. Since the conventional NAND flash memory device can use small cell current, the memory cells connected to one word line can be programmed by a one-time program operation.

FIG. 2B is a circuit diagram illustrating memory cells included in a conventional NOR flash memory device.

Referring to FIG. 2B, the conventional NOR flash memory device includes a plurality of memory cells M21 through M26 connected to bit lines BL1 and BL2 and a source line CSL. Since the conventional NOR flash memory device can use large cell current, a predetermined number of memory cells may be programmed by a one-time program operation.

FIGS. 3A and 3C are graphs illustrating cell threshold voltages of stored data when memory cells of a flash memory device are single-level memory cells. FIGS. 3B and 3D are graphs illustrating cell threshold voltages of stored data when memory cells of a flash memory device are multi-level memory cells.

Referring to FIGS. 3A and 3C, 1-bit data is stored with two different threshold voltages that are programmed in the single-level memory cell. For example, in the case of FIG. 3A, when a threshold voltage programmed in the single-level memory cell ranges 1 through 3V, data stored in the single-level memory cell is logic "1". When a threshold voltage programmed in the single-level memory cell ranges from 5 to 7V, data stored in the single-level memory cell is logic "0". FIG. 3A illustrates a voltage distribution of a single-level cell NOR flash memory device. FIG. 3C illustrates a voltage distribution of a single-level cell NAND flash memory device.

Referring to FIGS. 3B and 3D, 2-bit data is stored with 4 different threshold voltages that are programmed in the multi-level memory cell. For example, when a threshold voltage programmed in the multi-level memory cell ranges from 1 to 3V, data stored in the multi-level memory cell is logic "11". When a threshold voltage programmed in the multi-level memory cell ranges from 3.8 to 4.2V, data stored in the multi-level memory cell is logic "10". When a threshold voltage programmed in the multi-level memory cell ranges from 4.9 to 5.4V, data stored in the multi-level memory cell is logic "01". When a threshold voltage programmed in the multi-level memory cell ranges from 6.5 to 7.0V, data stored in the multi-level memory cell is logic "00". FIG. 3B illustrates a voltage distribution of a multi-level cell NOR flash memory device. FIG. 3D illustrates a voltage distribution of a multi-level cell NAND flash memory device.

Data stored in a single-level or multi-level memory cell of the flash memory device is identified according to a difference in cell current during a data read operation. The operations and types of the conventional flash memory devices described above are well known to one of ordinary skill in the art, and thus a detailed explanation thereof need not be given.

Flash memory devices use not only program voltages of various levels, but also use high voltages of various levels such as read voltages, pass voltages, and erase voltages. In general, flash memory devices include a high voltage generating circuit in order to generate high voltages of various levels. Since a margin between voltages in the flash memory devices may be small, it may be desirable to generate a high voltage of an accurate level. For example, when multi-level cell flash memory devices perform a program operation by using an increment step plus program (ISPP) method, step voltages with a smaller margin may be used and, thus, it may be further desirable to generate a voltage of an accurate level. Accordingly, flash memory devices generally include a circuit for measuring a high voltage and checking whether the high voltage has an accurate level.

FIG. 4 is a block diagram of a conventional circuit 40 for measuring a high voltage.

Referring to FIG. 4, the conventional circuit 40 includes a plurality of switch units 40_1 through 40_n. The switch units 40_1 through 40_n receive input high voltages of different levels. When corresponding enable signals are activated, the switch units 40_1 through 40_n apply corresponding input high voltages to corresponding high voltage measurement pads.

For example, the first switch unit 40_1 receives a first input high voltage HV1 of a first level, and the second switch unit 40_2 receives a second input high voltage HV2 of a second level. Likewise, the nth switch unit 40_n receives an nth input high voltage HVn of an nth level. When a first enable signal EN1 is activated, the first switch unit 40_1 outputs the first input high voltage HV1 to a first high voltage measurement pad MPAD1. Next, a measurement unit (not shown) measures the voltage of the first high voltage measurement pad MPAD1, and measures the voltage level of the first input high voltage HV1. The second through nth switch units 40_2 through 40_n operate in the same manner.

When the switch units of FIG. 4 apply corresponding input high voltages to measurement pads in response to corresponding enable signals, transistors are used as switches. Accordingly, in order to measure a given high voltage, a high voltage that exceeds the given high voltage by at least a threshold voltage should be applied to a gate of a transistor. That is, in order to measure one high voltage, another separate high voltage may need to be generated and also may need to be measured. Furthermore, in order to measure high voltages of different levels, the conventional circuit 40 should include measurement pads corresponding to the high voltages of different levels.

SUMMARY OF THE INVENTION

Integrated circuit devices according to some embodiments of the present invention include a plurality of operational circuits that are configured to operate from a plurality of power supply voltages and from a plurality of high voltages that are generated in the integrated circuit device from the plurality of power supply voltages. A circuit for measuring the plurality of high voltages is also provided in the integrated circuit. The circuit includes a common high voltage measurement pad and a plurality of high voltage switch units connected to the common high voltage measurement pad. A respective high voltage switch unit is configured to transmit a corresponding one of the plurality of high voltages to the common high voltage measurement pad in response to a corresponding enable signal. In some embodiments, the operational circuits may comprise non-volatile memory cells, such as flash memory cells. Methods of measuring a plurality of high voltages in an integrated circuit device are also provided by transmitting a corresponding one of the plurality of high voltages to a common high voltage measurement pad in response to a corresponding enable signal.

According to other embodiments of the present invention, there is provided a circuit for measuring a high voltage. The circuit comprises a common high voltage measurement pad and a plurality of high voltage switch units connected to the common high voltage measurement pad, wherein each of the high voltage switch units comprises a switching unit transmitting a corresponding input high voltage to the high voltage measurement pad in response to a corresponding enable signal.

A respective switching unit may comprise a first switch configured to turn on in response to activation of the corresponding enable signal and to apply the corresponding high voltage to the common high voltage measurement pad, and a second switch configured to reduce or prevent leakage current from flowing through the first switch during an off period of the first switch.

In some embodiments, the first switch and the second switch are serially connected (in any order) between the corresponding high voltage and the common high voltage measurement pad. For example, in some embodiments, the first switch may have an end to which the corresponding high voltage is applied and another end connected to an end of the second switch. The first switch may be a p-channel metal oxide semiconductor (PMOS) transistor gated by an inverted signal of the enable signal. The second switch may have an end connected to the other end of the first switch and another end connected to the high voltage measurement pad. The second switch may be a depletion transistor gated by the input high voltage. In other embodiments, the first switch may have an end connected to an end of the second switch and another end connected to the high voltage measurement pad. The second switch may have an end connected to an end of the first switch and another end to which the corresponding high voltage is applied.

The switching unit may comprise a plurality of second switches. Thus, in some embodiments, the plurality of second switches may comprise a first-second switch and a second-second switch. The first switch, the first-second switch and the second-second switch are serially connected (in any order) between the corresponding high voltage and the common high voltage measurement pad. In some embodiments, when the plurality of second switches comprise a first-second switch and a second-second switch, the first switch may have an end connected to an end of the first-second switch and another end connected to an end of the second-second switch. When the plurality of second switches comprise a first-second switch and a second-second switch, the first-second switch may have an end connected to an end of the first switch and another end to which the high voltage is applied, and the second-second switch may have an end connected to the other end of the first switch and another end connected to the high voltage measurement pad.

In some embodiments, the second-second switch may have a channel length greater than that of the first-second switch. The second-second switch may have a channel length twice as large as the first-second switch.

Each of the high voltage switch units may further comprise a control unit configured to apply a corresponding high voltage to a gate of a corresponding second switch in response to the activation of the corresponding enable signal.

The plurality of high voltage switch units may receive input high voltages of different levels.

The circuit may further comprise a plurality of high voltage measurement pads. The plurality of high voltage measurement pads may be shared by an arbitrary number of high voltage switch units, by the same number of high voltage switch units, and/or by a different number of high voltage switch units.

According to other embodiments of the present invention, there is provided a non-volatile memory device including any of the above-described circuits. The non-volatile memory device may be a flash memory device.

In still other embodiments of the present invention, the plurality of high voltage switch units are configured to transmit the corresponding one of the plurality of high voltages to the common high voltage measurement pad in response to a corresponding enable signal at a given one of the high voltage switch units, and to isolate remaining high voltages at remaining ones of the high voltage switch units from the common high voltage measurement pad.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
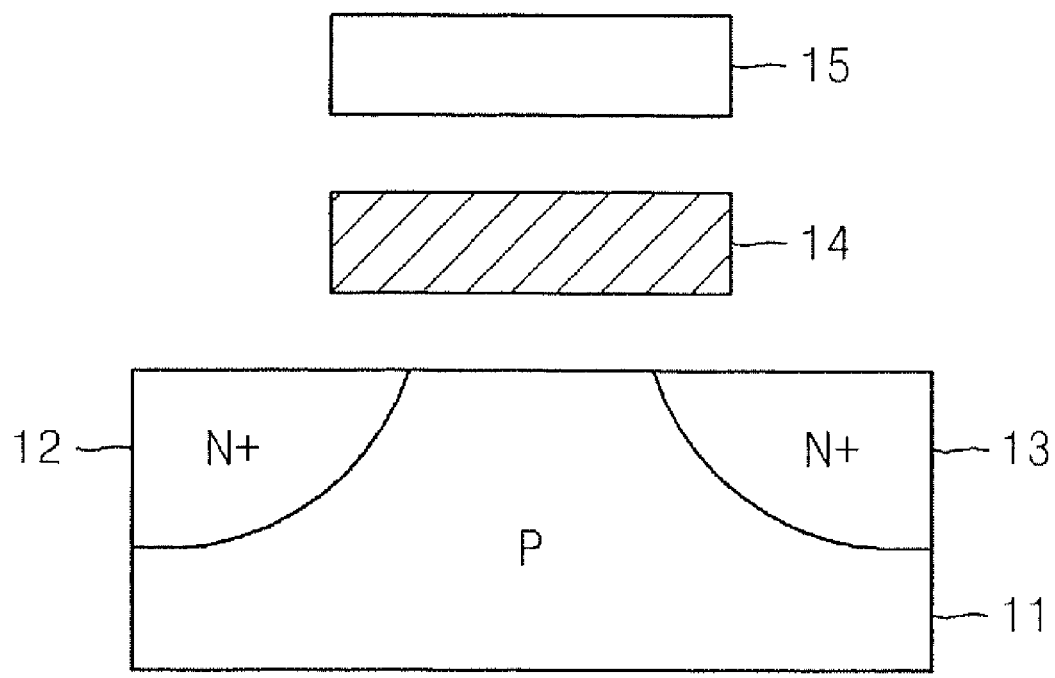
FIG. 1 is a cross-sectional view illustrating a structure of a unit cell of a conventional flash memory device.
Figure 2A:
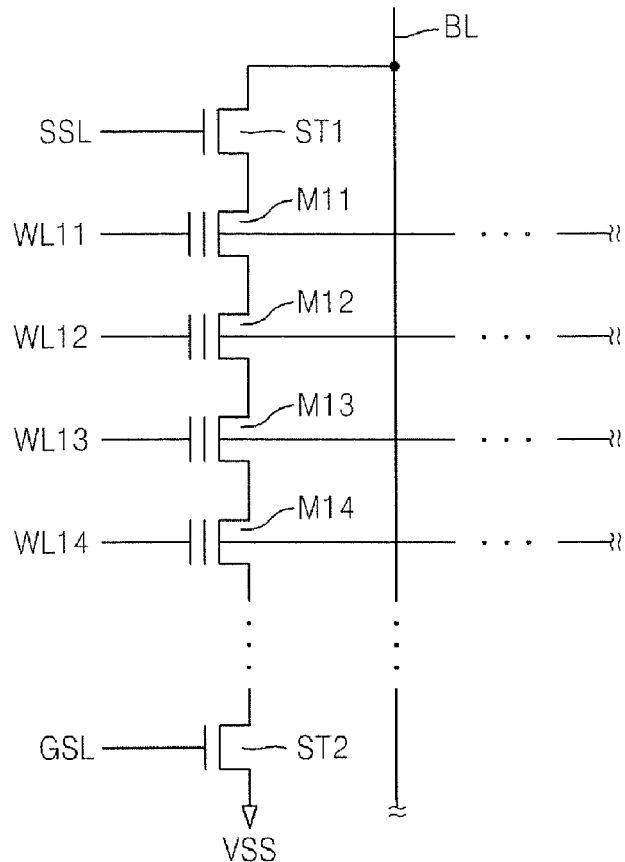
FIG. 2A is a circuit diagram illustrating memory cells included in a conventional NAND flash memory device.
Figure 2B:
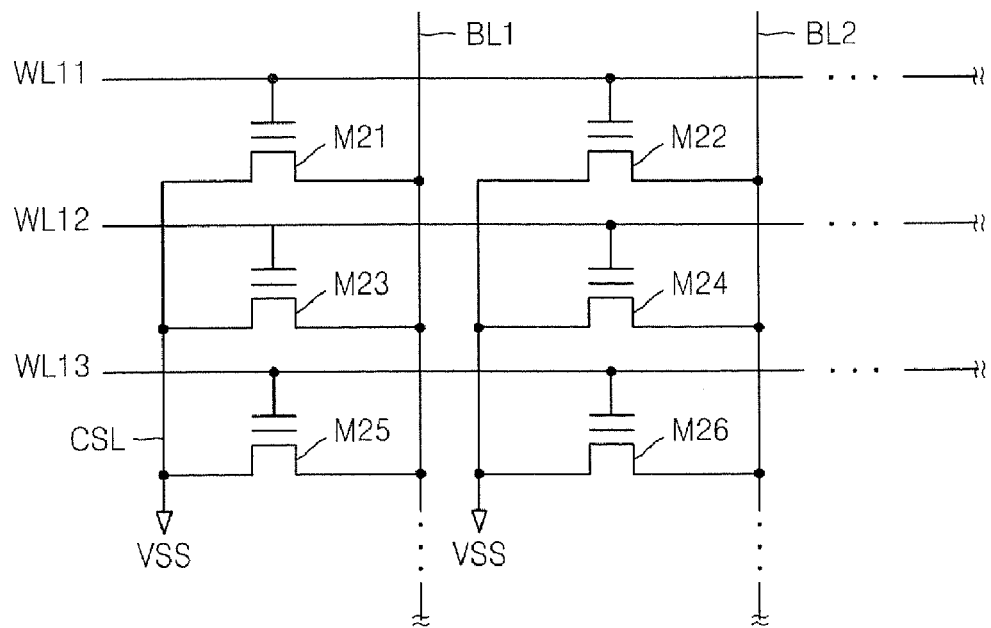
FIG. 2B is a circuit diagram illustrating memory cells included in a conventional NOR flash memory device.
Figure 3A:
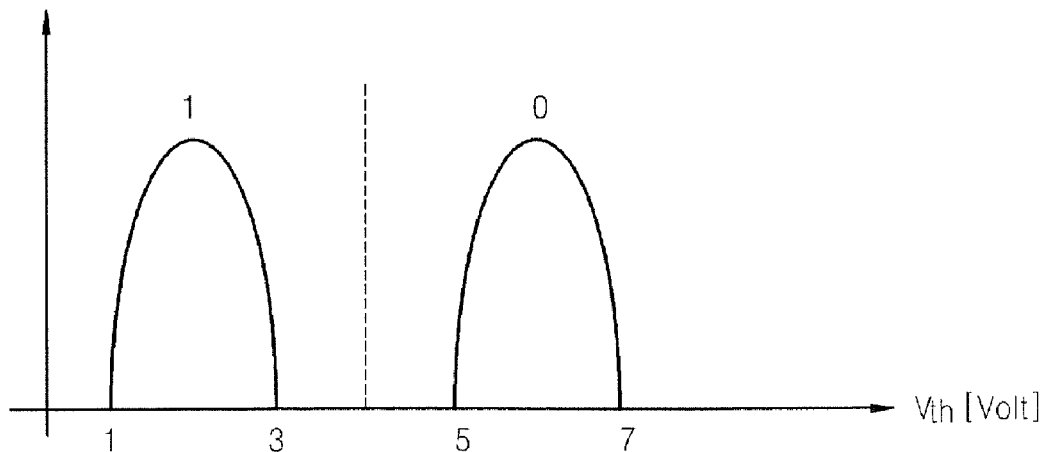
FIGS. 3A and 3C illustrate cell threshold voltages of stored data when memory cells of a conventional flash memory device are single-level memory cells.
Figure 3B:
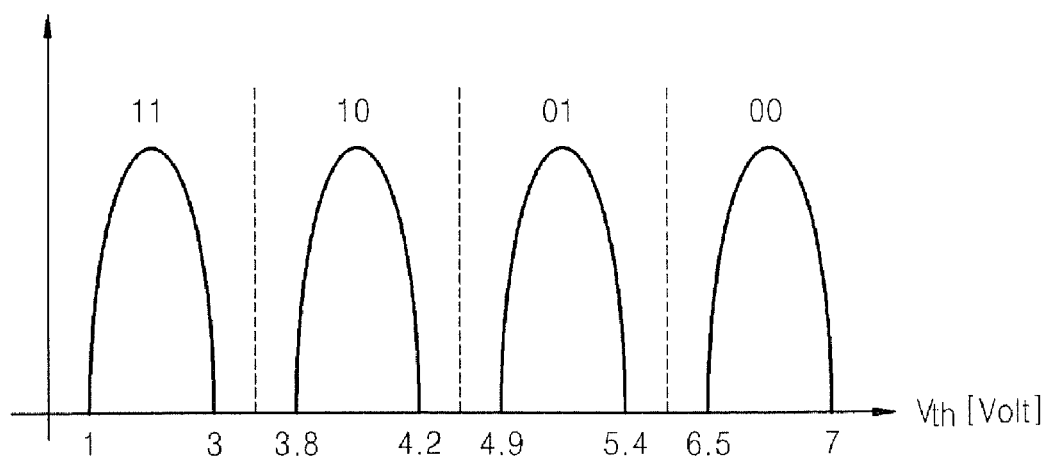
FIGS. 3B and 3D illustrate cell threshold voltages of stored data when memory cells of a conventional flash memory device are multi-level memory cells.
Figure 3C:
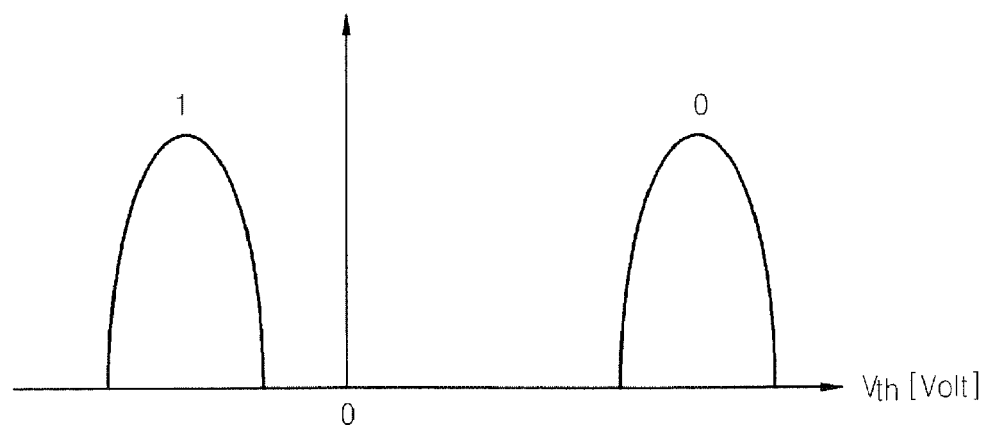
Figure 3D:
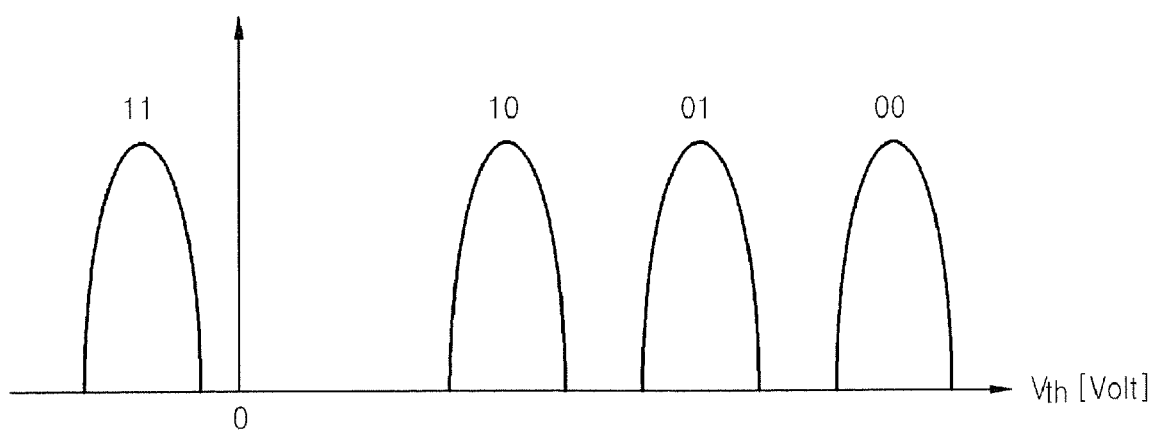
Figure 4:
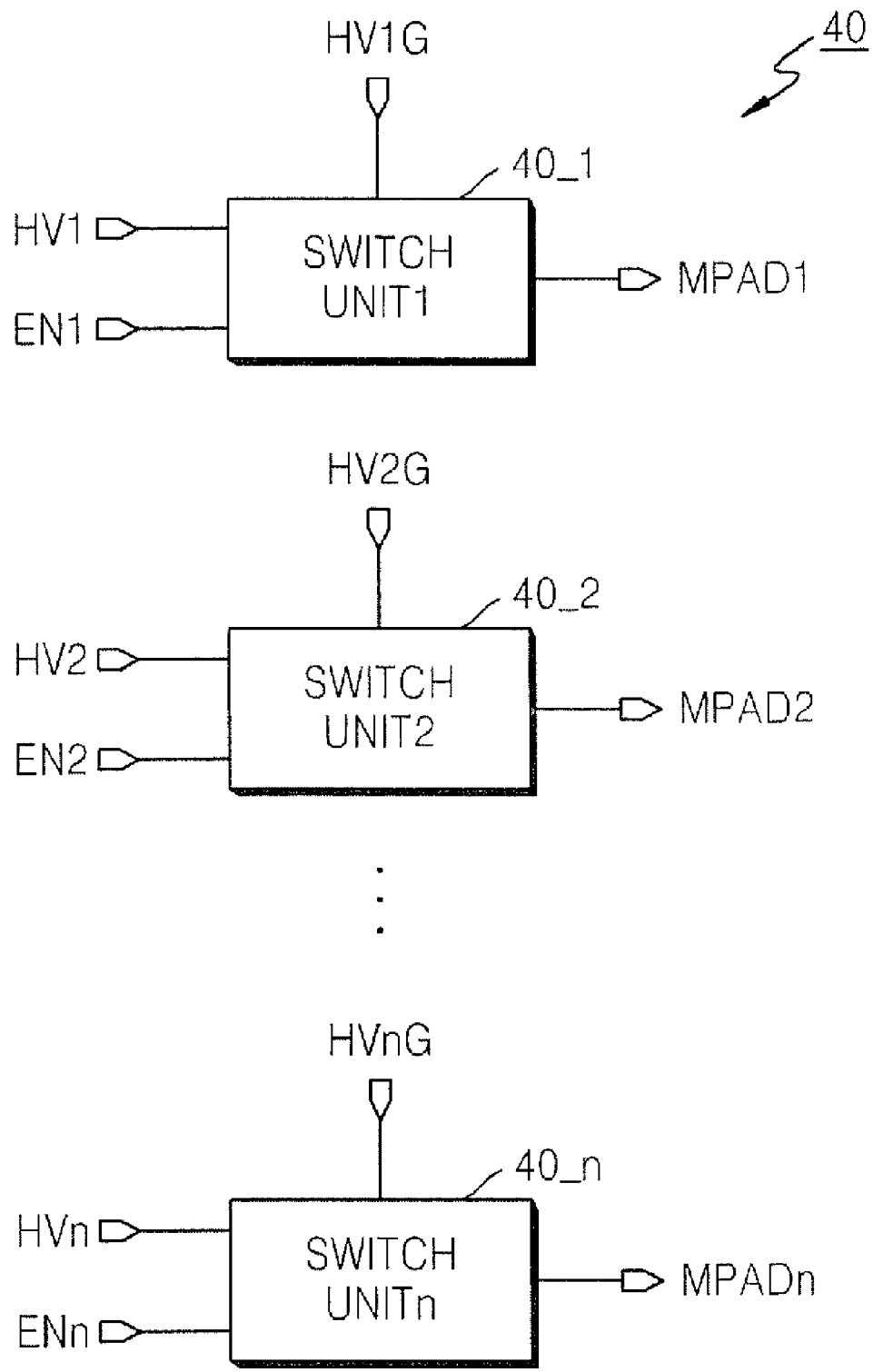
FIG. 4 is a block diagram of a conventional circuit for measuring a high voltage.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity. Moreover, each embodiment described and illustrated herein includes its complementary conductivity type embodiment as well.

It will be understood that when an element or layer is referred to as being "on," "connected to" or "coupled to" another element or layer (and variants thereof, it can be directly on, connected or coupled to the other element or layer or intervening elements or layers may be present. In contrast, when an element is referred to as being "directly on," "directly connected to" or "directly coupled to" another element or layer (and variants thereof, there are no intervening elements or layers present. Like reference numerals refer to like elements throughout. As used herein, the term "and/or" includes any and all combinations of one or more of the associated listed items.

It will be understood that, although the terms first, second, odd, even, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or odd element, component, region, layer or section discussed below could be termed a second or even element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It also will be understood that, as used herein, the terms "row" or "horizontal" and "column" or "vertical" indicate two relative non-parallel directions that may be orthogonal to one another. However, these terms also are intended to encompass different orientations.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Exemplary embodiments are described below with reference to block diagrams of circuits. However, the functionality of a given block of the block diagrams may be separated into multiple blocks and/or the functionality of two or more blocks of the block diagrams may be at least partially integrated Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 15:
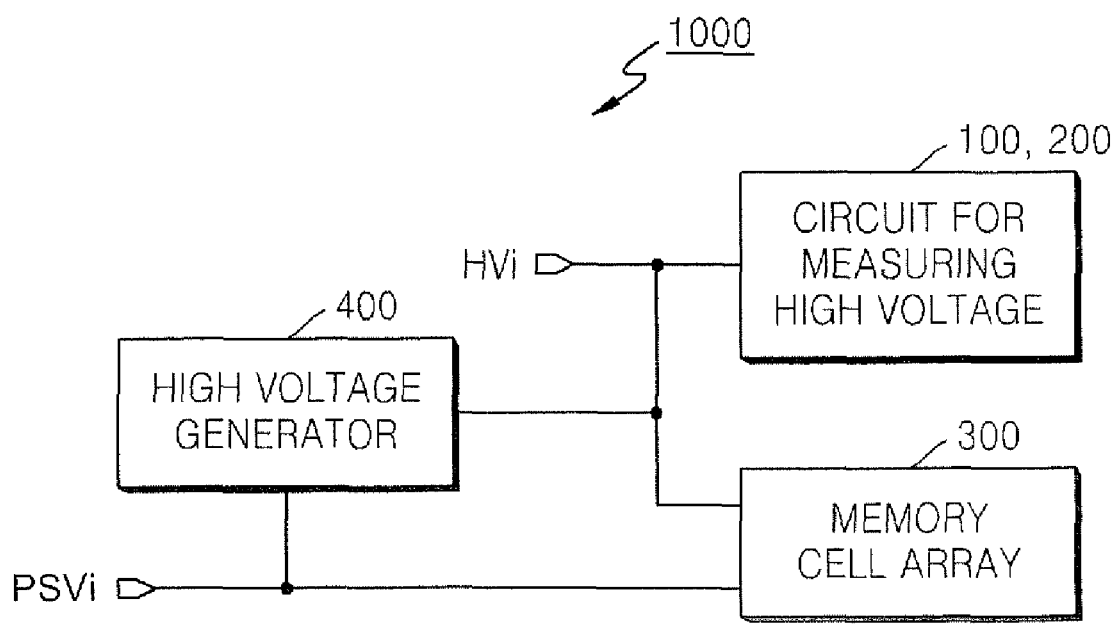
FIG. 15 is a block diagram of a non-volatile memory device including a circuit for measuring a high voltage according to various embodiments of the present invention.

FIG. 15 is a block diagram of an integrated circuit device 1000, such as a non-volatile memory device, according to various embodiments of the present invention. As shown in FIG. 15, the integrated circuit device includes a plurality of operational circuits, such as a memory cell array 300, and, in particular, a flash memory cell array, that are configured to operate from a plurality of power supply voltages PSVi, and plurality of high voltages HVi that are generated in the integrated circuit device 1000 from the plurality of power supply voltages PSVi using, for example, a high voltage generator 400. A circuit 100, 200 for measuring the plurality of high voltages HVi is provided according to various embodiments of the invention that will now be described in detail.

Figure 5:
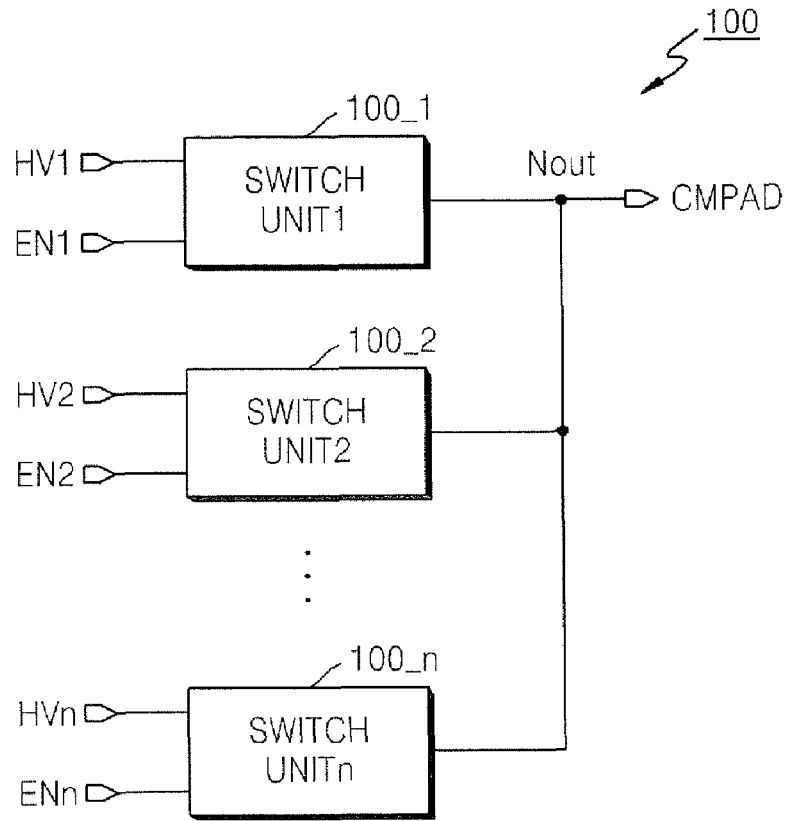
FIG. 5 is a block diagram of a circuit for measuring a high voltage according to various embodiments of the present invention.
Figure 6:
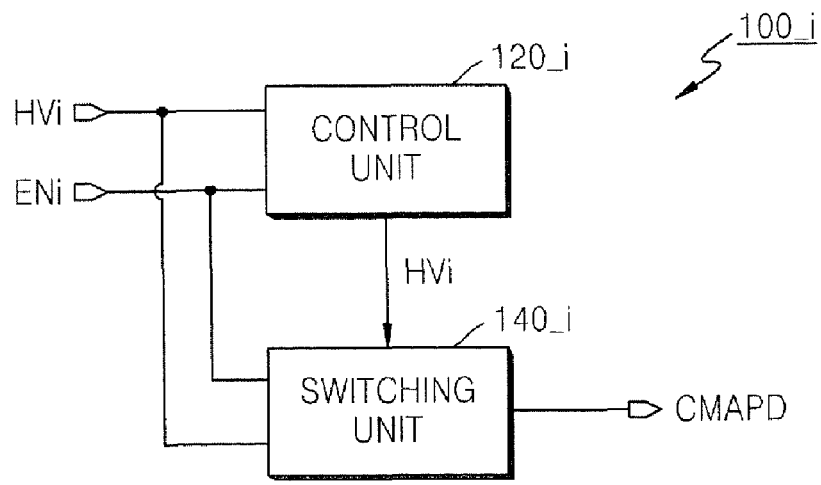
FIG. 6 is a block diagram of a high voltage switch unit of the circuit of FIG. 5 according to various embodiments of the present invention.

FIG. 5 is a block diagram of a circuit 100 for measuring the plurality of high voltages according to various embodiments of the present invention. FIG. 6 is a block diagram of a high voltage switch unit of a circuit 100 of FIG. 5 according to various embodiments of the present invention.

Referring to FIGS. 5 and 6, the circuit 100 includes a plurality of high voltage switch units 100_1 through 100_n connected to a common high voltage measurement pad CMPAD. The high voltage switch units 100_1 through 100_n may receive input high voltages HV1 through HVn of different levels. Levels of the input high voltages HV1 through HVn may correspond to levels of program voltages, read voltages and/or pass voltages as described above.

An ith high voltage switch unit 100_i among the plurality of high voltage switch units 100_1 through 100_n is shown in FIG. 6 and will now be explained. For convenience, the ith high voltage switch unit 100_i is referred to as a high voltage switch unit unless otherwise noted. Other high voltage switch units may have the same structure and function as those of the ith high voltage switch unit 100_i.

A high voltage switch unit 100_i includes a switching unit 140_i. The switching unit 140_i transmits a corresponding input high voltage HVi to the high voltage measurement pad CMPAD in response to a corresponding enable signal ENi. For example, the ith high voltage switch unit 100_i transmits an ith input high voltage HVi to the high voltage measurement pad CMPAD in response to an ith enable signal ENi. For convenience, an enable signal corresponding to the ith high voltage switch unit 100_i and an ith input high voltage are referred to as an enable signal ENi and an input high voltage HVi unless otherwise noted.

Figure 7:
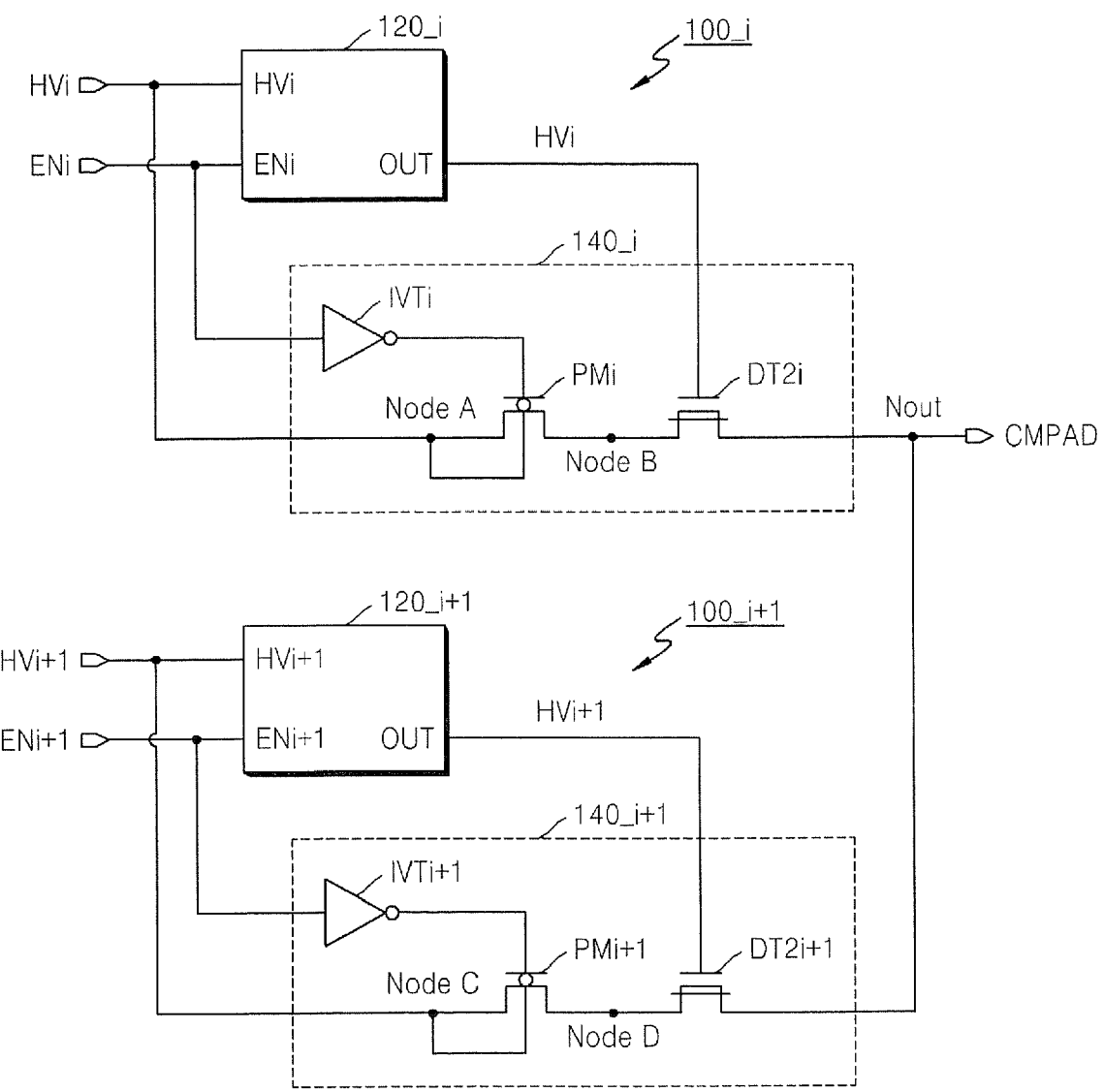
FIG. 7 is a circuit diagram of a switching unit of a high voltage switch unit of FIG. 6 according to various embodiments of the present invention.

FIG. 7 is a circuit diagram of a switching unit of the high voltage switch unit of FIG. 6 according to various embodiments of the present invention.

Referring to FIGS. 6 and 7, a switching unit 140_i may include a first switch PMi. The first switch PMi is turned on in response to the activation of an enable signal ENi, and applies an input high voltage HVi to the high voltage measurement pad CMPAD. The first switch PMi may be a p-channel metal oxide semiconductor (PMOS) transistor gated by an inverted signal of the enable signal ENi. In this case, a target high voltage to be measured can be switched without threshold voltage loss.

The case where a second switch which is a depletion transistor is not present will be explained first.

That is, when the circuit 100 desires to measure an ith input high voltage HVi, an ith enable signal ENi having a logic high level is transmitted to the ith high voltage switch unit 100_i. The first switch PMi is turned on, and applies the ith input high voltage HVi to the high voltage measurement pad CMPAD, and a measurement unit (not shown) measures the ith input high voltage HVi applied to the high voltage measurement pad CMPAD.

The operation of the switching unit 140_i of FIG. 7 will now be explained in detail. When the enable signal ENi having the logic high level is applied, the enable signal ENi is inverted by an inverter IVTi and is transmitted to a gate of the first switch (PMOS transistor) PMi. Accordingly, the first switch (PMOS transistor) PMi is turned on, and the input high voltage HVi is applied to a node A of the first switch (PMOS transistor) PMi and transmitted to a node B, which acts as an output node NOUT, of the first switch (PMOS transistor) PMi. The input high voltage HVi applied to the node B of the first switch (PMOS transistor) PMi can be measured.

In order to measure an i+1th input high voltage HVi+1, an i+1th enable signal ENi+1 having a logic high level is applied. When the ith enable signal ENi is set to logic low, a first switch PMi+1 of an i+1th high voltage switch unit 100_i+1 is turned on and the first switch PMi of the ith voltage switch unit 100_i is turned off. Accordingly, the i+1th input high voltage HVi+1 is applied to the high voltage measurement pad CMPAD.

In this case, however, due to the i+1th input high voltage HVi+1 applied to an output node NOUT, current may flow through the first switch PMi of the ith high voltage switch unit 100_i that should be turned off.

Figure 8A:
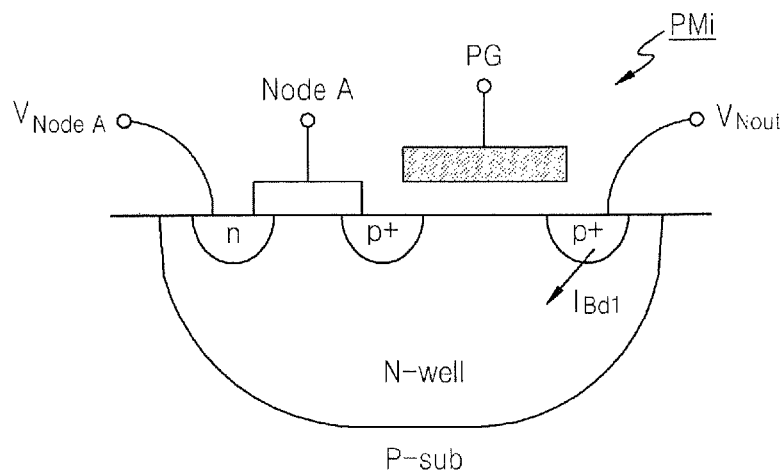
FIG. 8A is a cross-sectional view for explaining the operation of a first switch of a switching unit of FIG. 7 according to various embodiments of the present invention.

FIG. 8A is a cross-sectional view for explaining the operation of a first switch of the switching unit of FIG. 7 according to some embodiments of the present invention.

Referring to FIGS. 7 and 8A, an ith input high voltage HVi is applied to the node A of the first switch PMi, and an i+1th input high voltage HVi+1 which is an output node voltage VNOUT is applied to the output node NOUT. Accordingly, the ith input high voltage HVi is applied to an N-well of the first switch PMi, and the i+1th input high voltage HVi+1 is applied to a p+ region of the first switch PMi connected to the output node NOUT.

However, when a voltage level of the i+1th input high voltage HVi+1 is higher than that of the ith input high voltage HVi by a breakdown voltage of a PN-junction of the first switch (PMOS transistor) PMi or more, leakage current IBD1 flows from the p+ region to the N-well of the first switch (PMOS transistor) PMi.

Referring to FIG. 7 again, in order to reduce or prevent such leakage current flowing through a first switch during an off period of the first switch, the circuit 100 of FIG. 7 may further include a second switch connected to the first switch. In particular, referring to FIG. 7, an input high voltage HVi may be applied to the node A of the first switch PMi, the node B of the first switch PMi may be shared with a second switch DT2i, and an output node NOUT of the second switch DT2i may be connected to the high voltage measurement pad CMPAD.

The second switch DT2i may be a depletion transistor (also referred to as a depletion mode transistor) gated by the input high voltage HVi. In particular, the second switch DT2i may be an n-type depletion transistor DT2i. The input high voltage HVi applied to a gate of the depletion transistor DT2i may be supplied by a control unit 120_i. A control unit may be included in each of the high voltage switch units 100_1 through 100_n and may apply a corresponding input high voltage to a gate of a corresponding second switch in response to the activation of a corresponding enable signal.

Figure 9A:
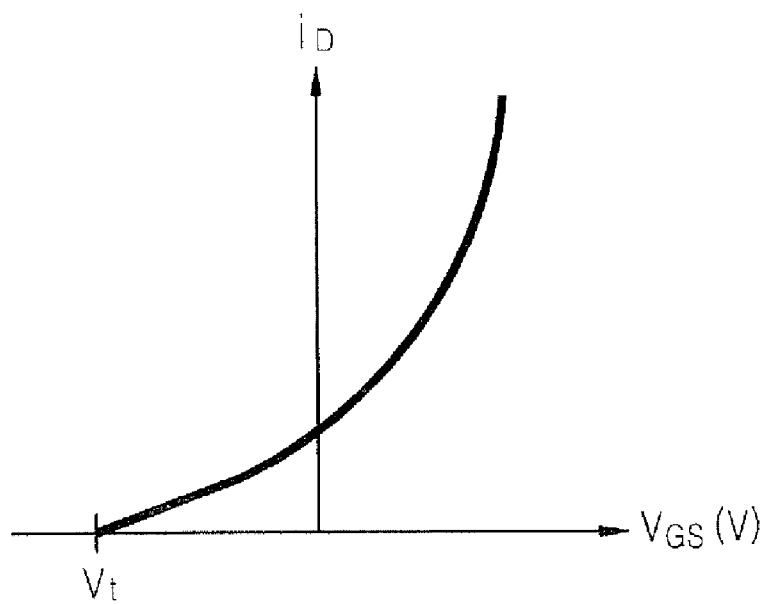
FIG. 9A illustrates a graph and FIG. 9B is a cross-sectional view for explaining the operating principle of a depletion transistor of a switching unit of FIG. 7 according to various embodiments of the present invention.
Figure 9B:
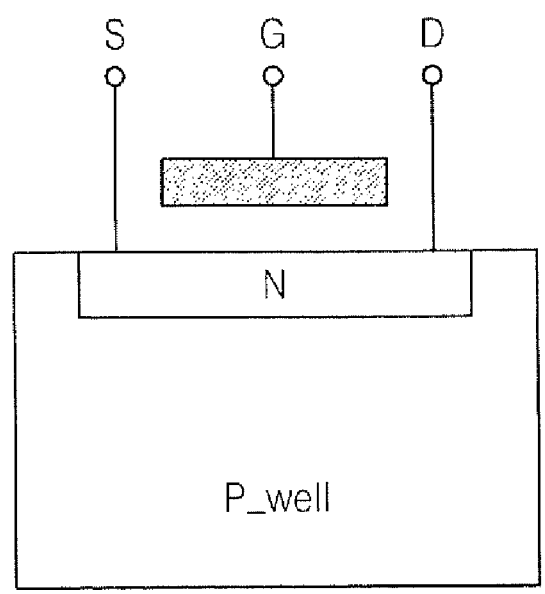

FIG. 9A is a graph and FIG. 9B is a cross-sectional view for explaining the operating principle of a depletion transistor of the switching unit of FIG. 7 according to some embodiments of the present invention.

A depletion transistor is characterized in that a channel is physically formed and then depleted of carriers. In particular, referring to FIG. 9B, an n-type depletion transistor is structured such that an n-type silicon region connecting a source and a drain acts as a channel over a p-type well. Accordingly, although an enhanced transistor is formed such that a channel is not formed when no voltage is applied to a gate, the depletion transistor is formed such that current iD may flow, irrespective of a gate voltage, when a voltage is applied between the source and the drain.

Also, a threshold voltage Vt is a gate-source voltage VGS where no carriers are present in a channel. Referring to FIG. 9A, a depletion transistor has a negative threshold voltage. For example, the depletion transistor may have a threshold voltage of approximately −4V.

The circuit 100 of FIG. 7 uses the aforesaid characteristics of the depletion transistor. That is, the circuit 100 of FIG. 7 uses the operating principle that even when a voltage is not applied to a gate of a depletion transistor, a voltage drop may occur between a source and a drain between the depletion transistor.

Figure 8B:
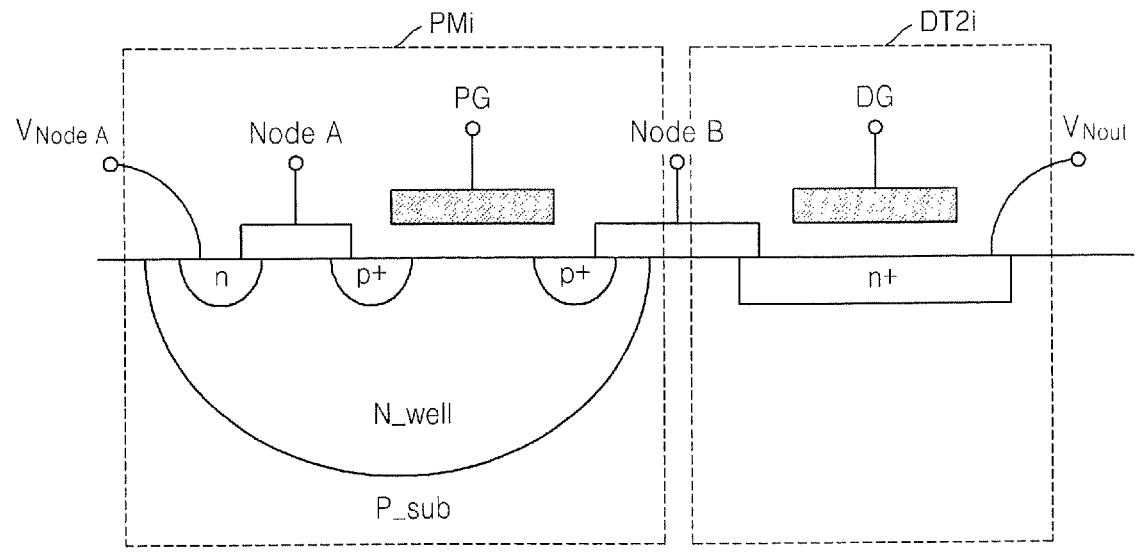
FIG. 8B is a cross-sectional view of first and second switches of a switching unit of FIG. 7 when the first and second switches are connected to each other according to various embodiments of the present invention.

FIG. 8B is a cross-sectional view of first and second switches of the switching unit of FIG. 7 when the first and second switches are connected to each other according to some embodiments of the present invention.

Referring to FIGS. 7 and 8B, when an ith enable signal ENi having a logic low level is applied, the first switch (PMOS transistor) PMi is turned off and the control unit 120_i does not apply an input high voltage HVi to a gate DG of the second switch (depletion transistor) DT2i.

As described above, it is assumed that an i+1th input high voltage HVi+1 is applied to the output node NOUT. Due to a voltage drop between a source and a drain of the second switch (depletion transistor) DT2i, a voltage lower than the i+1th input high voltage HVi+1 by a threshold voltage of the second switch (depletion transistor) DT2i is applied to the node B. When a threshold voltage of the second switch (depletion transistor) DT2i is adjusted so that a difference between the voltage applied to the node B and a voltage of the p+ region of the first switch (PMOS transistor) PMi connected to the node B is lower than a breakdown voltage of a PN-junction of the first switch (PMOS transistor) PMi, such leakage current as shown in FIG. 8A can be reduced or prevented.

Accordingly, in some embodiments of the present invention, the plurality of high voltage switch units are configured to transmit a corresponding one of the plurality of high voltages to the common high voltage measurement pad in response to a corresponding enable signal at a given one of the high voltage switch units, and to isolate the remaining high voltages of remaining ones of the high voltage switch units from the common high voltage measurement pad.

Figure 10:
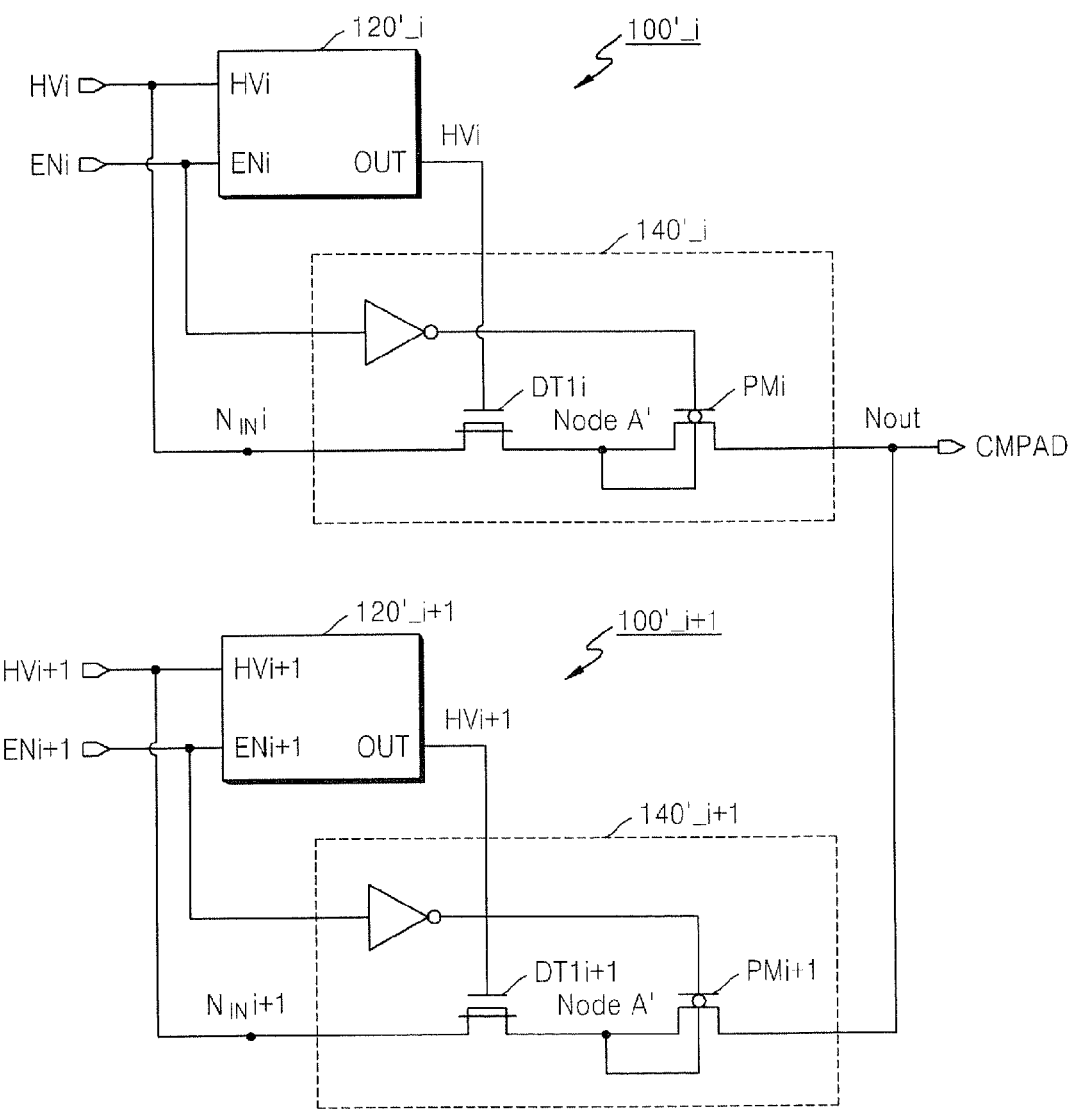
FIG. 10 is a circuit diagram of a switching unit of a high voltage switch unit of 6 according to other embodiments of the present invention.

FIG. 10 is a circuit diagram of a switching unit of a high voltage switch unit of FIG. 6 according to other embodiments of the present invention.

A switching unit 140'_i of FIG. 10 is different from the switching unit 140_i of FIG. 7 in the arrangement of switches. That is, although the operation of a first switch PMi of the switching unit 140'_i of FIG. 10 is the same as that of the first switch PMi of the switching unit 140_i of FIG. 7, the first switch PMi of FIG. 10 may have a node A' connected to a second switch DT1i and an output node NOUT connected to the high voltage measurement pad CMPAD. Also, a second switch DT1i may share the node A' with the first switch PMi and have a node NINi to which an input high voltage HVi is applied.

Figure 11A:
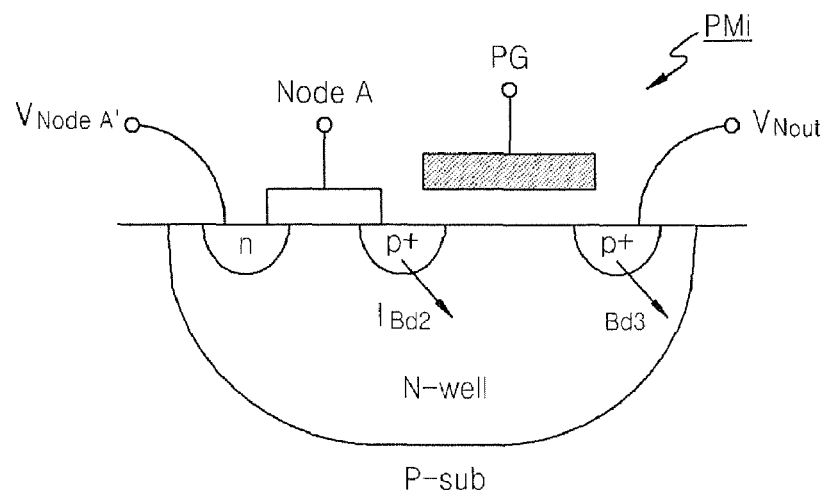
FIG. 11A is a cross-sectional view for explaining the operation of a first switch of a switching unit of FIG. 10 according to various embodiments of the present invention.

FIG. 11A is a cross-sectional view for explaining the operation of a first switch of the switching unit of FIG. 10 according to some embodiments of the present invention.

Referring to FIGS. 10 and 11A, if the second switch DT1i is not present, even though an ith enable signal ENi is set to logic low, an ith input high voltage HVi is applied to the node A' (=NINi) of the first switch (PMOS transistor) PMi. Accordingly, the ith input high voltage HVi may be applied to an N-well of the first switch (PMOS transistor) PMi.

When a p+ region of the first switch (PMOS transistor) PMi is a low voltage region and a difference between a voltage of the p+ region and the ith input high voltage HVi is higher than a breakdown voltage of a PN-junction of the first switch (PMOS transistor) PMI, leakage current IBD2 and IBD3 may flow from the p+ region to the N-well.

Figure 11B:
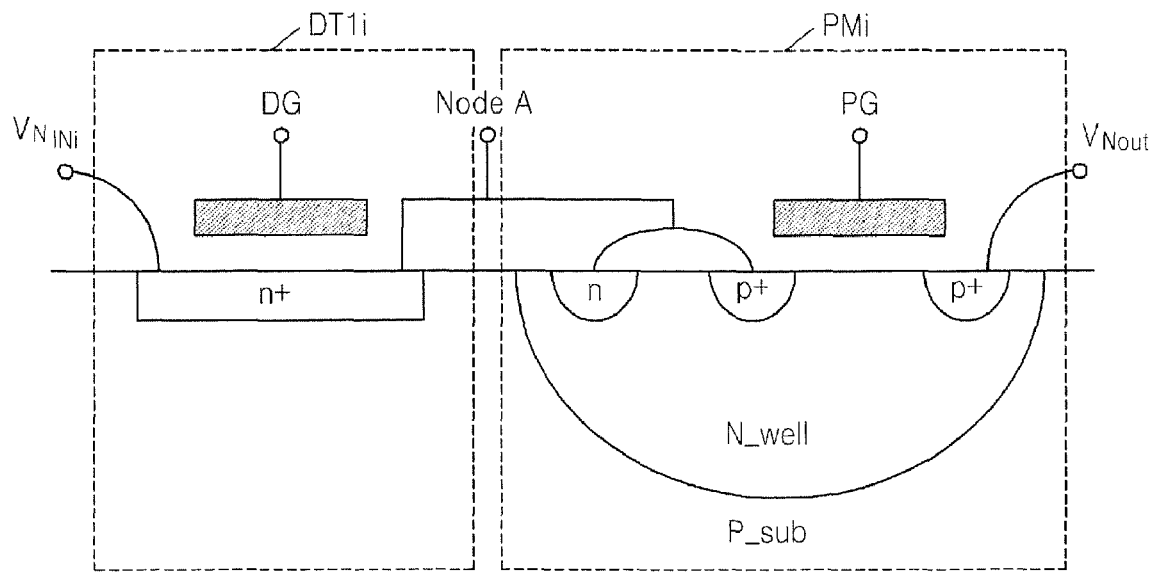
FIG. 11B is a cross-sectional view of first and second switches of a switching unit of FIG. 10 when the first and second switches are connected to each other according to various embodiments of the present invention.

FIG. 11B is a cross-sectional view illustrating first and second switches of the switching unit of FIG. 10 when the first switch and the second switch are connected to each other according to various embodiments of the present invention.

Referring to FIGS. 10 and 11B, the circuit 100 may include the second switch DT1i disposed between the first switch PMi and an input high voltage HVi. As described above, even when an ith enable signal ENi is set to logic low such that the first switch PMi enters an off mode, the second switch DT1i, which is a depletion transistor, operates. Accordingly, a voltage lower than the ith input high voltage HV by a threshold voltage of the second switch (depletion transistor) DT1i is applied to the node A'. When the threshold voltage of the second switch (depletion transistor) DT1i is adjusted so that a difference between the voltage of the node A' and a voltage of the p+ region is lower than a breakdown voltage of a PN-junction of the first switch (PMOS transistor) PMi, such leakage current IBD2 and IBD3 as shown in FIG. 11A can be reduced or prevented.

Figure 12:
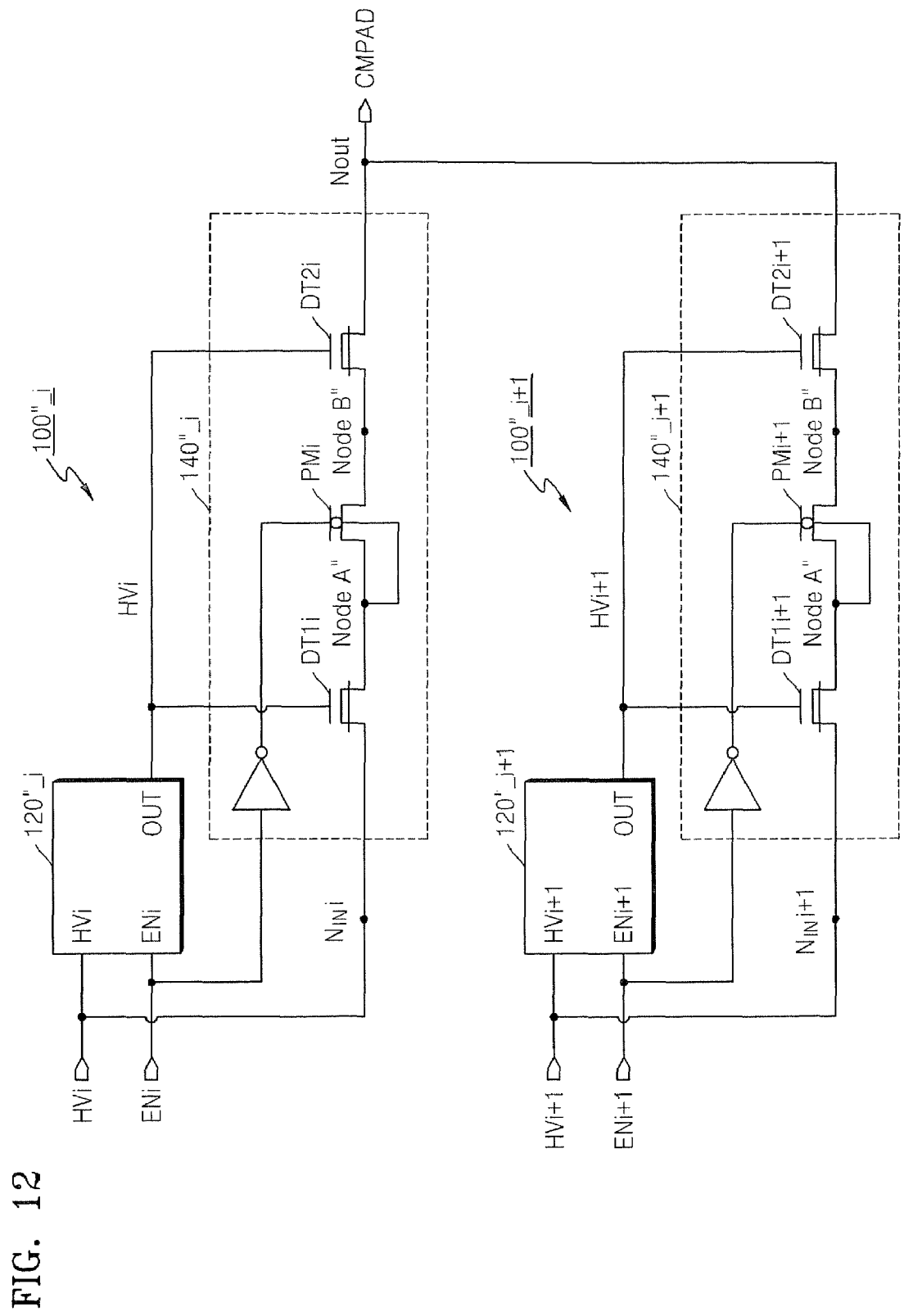
FIG. 12 is a circuit diagram of a switching unit of a high voltage switch unit of FIG. 6 according to other embodiments of the present invention.

FIG. 12 is a circuit diagram of a switching unit of the high voltage switch unit of FIG. 6 according to other embodiments of the present invention.

Referring to FIG. 12, a switching unit 140"_i may include a plurality of second switches. The switching unit 140"_i of FIG. 12 includes two second switches.

The switching unit 140"_i of FIG. 12 is different from the switching unit 140_i of FIG. 7 in the arrangement of switches. That is, when the second switches are a first-second switch DT1i and a second-second switch DT2i, the first switch PMi may be disposed between the first-second switch DT1i and the second-second switch DT2i. The first-second switch DT1i may share a node A" with the first switch PMi and have the other node NINi to which an input high voltage HVi is applied. The second-second switch DT2i may have a node B" shared with the first switch PMi and the other node NOUT connected to the high voltage measurement pad CMPAD. The operation of the first switch PMi of the switching unit 140"_i of FIG. 12 can be the same as that of the first switch PMi of FIGS. 7 and 10, and the operation of the first-second switch DT1i and the second-second switch DT2i of the switching unit 140"_i of FIG. 12 can be the same as that of the second switch DT1i of FIG. 10 and the second switch DT2i of FIG. 7, respectively.

Figure 13:
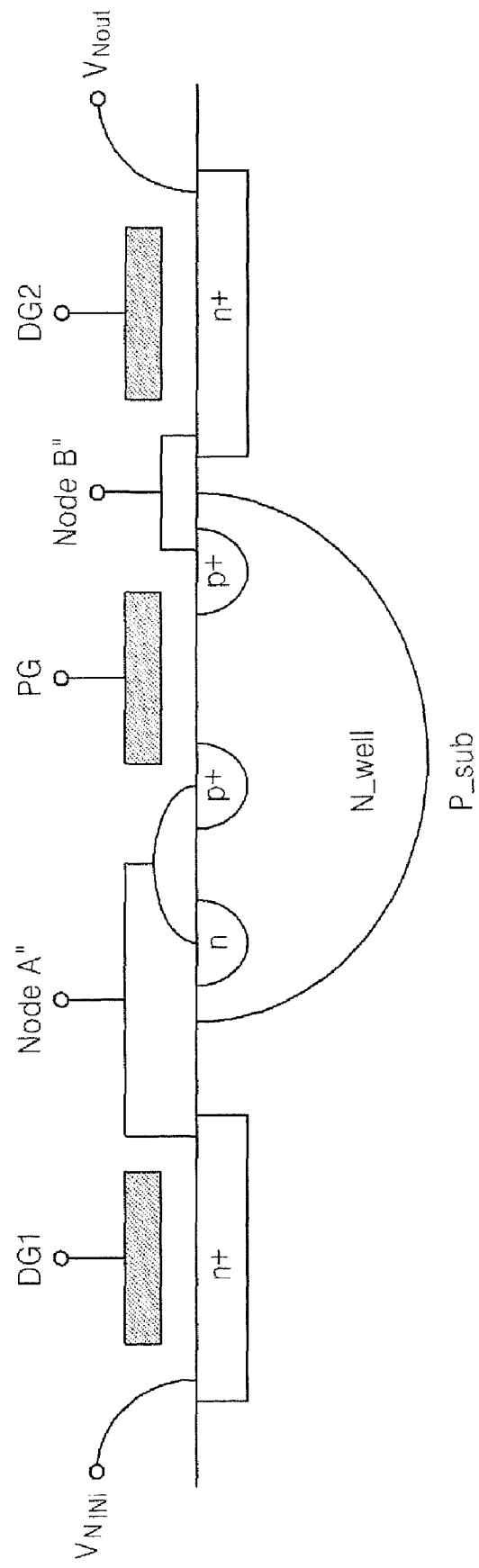
FIG. 13 is a cross-sectional view of switches of a switching unit of FIG. 12 for explaining operation of the switches according to various embodiments of the present invention.

FIG. 13 is a cross-sectional view of switches of the switching unit of FIG. 12 for explaining the operation of the switches according to some embodiments of the present invention.

Referring to FIGS. 12 and 13, the second switches (depletion transistors) DT1i and DT2i are disposed on both sides of the first switch (PMOS transistor) PMi, and thus such leakage current IBD1 through IBD3 as shown in FIGS. 8A and 11A can be reduced or prevented.

In some embodiments, the second-second switch (depletion transistor) DT2i may have a channel length greater than that of the first-second switch (depletion transistor) DT1i. In detail, the second-second switch DT2i may have a channel length twice as large as the first-second switch DT1i.

The channel length of the second-second depletion transistor DT2i may be physically twice as long as the first-second depletion transistor DT1i. By connecting two transistors having the same channel length as that of the first-second switch (depletion transistor) DT1i in series, the channel length of the second-second switch (depletion transistor) DT2i may be twice as long as that of the first-second depletion transistor DT1i.

A depletion transistor has a shut off voltage (threshold voltage) that varies depending on a drain voltage. As a drain voltage increases, a shut off voltage increases. If the first-second switch (depletion transistor) DT1i and the second-second switch (depletion transistor) DT2i have the same channel length, the first switch (PMOS transistor) PMi is in an off state, a low voltage is applied to a drain of the first-second switch (depletion transistor) DT1i, and another high voltage to be measured is applied to a drain of the second-second switch (depletion transistor) DT2i, a source voltage of the second-second depletion transistor may be increased. However, a body-source of the first switch (PMOS transistor) PMi is in connection with a source of the first-second switch (depletion transistor) DT1i. Accordingly, a drain voltage of the first switch (PMOS transistor) PMi becomes higher than a body-source voltage. At this time, a PN junction is turned on and very high current flows from a drain of the first switch (PMOS transistor) PMi to the body. In order to reduce or prevent the very high current by making a source voltage of the second-second switch (depletion transistor) DT2i having the same condition as that of the first-second switch (depletion transistor) DT1i, a shut off voltage of the second-second switch (depletion transistor) DT2i should be a low voltage all the time. Since a shut off voltage of a depletion transistor is in inverse proportion to a channel length, a channel length of the second-second switch (depletion transistor) DT2i should be greater, particularly twice greater, than that of the first-second switch (depletion transistor) DT1i.

Accordingly, the circuits 100 described above do not require a separate high voltage for gating a switch when measuring the level of one high voltage, unlike a conventional circuit for measuring a high voltage, and can reduce or prevent leakage current in a transistor by using a shared measurement pad when measuring high voltages of various levels.

Figure 14:
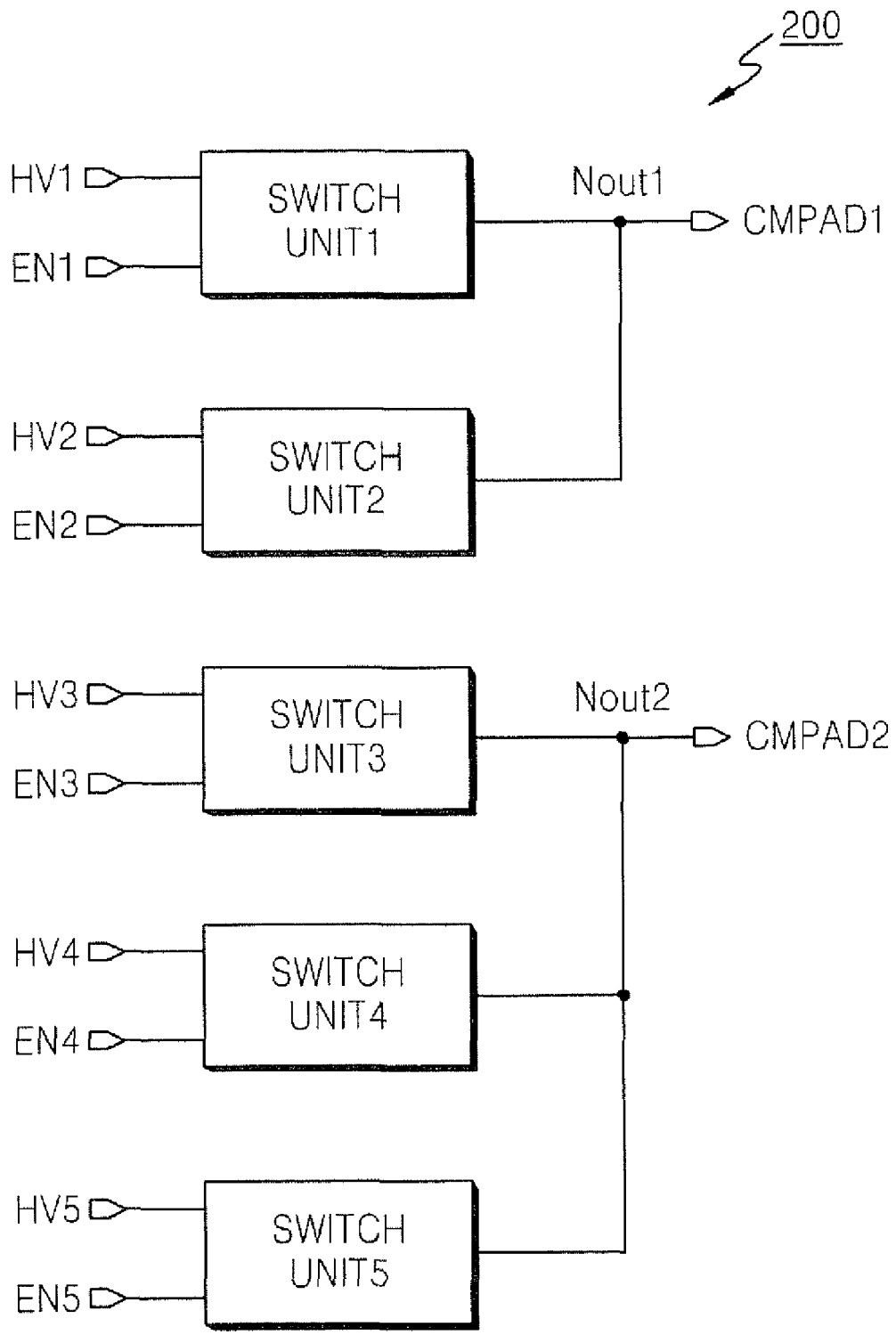
FIG. 14 is a block diagram of a circuit for measuring a high voltage according to various embodiments of the present invention.

FIG. 14 is a block diagram of a circuit 200 for measuring a high voltage according to other embodiments of the present invention.

Referring to FIG. 14, the circuit 200 may include a plurality of common high voltage measurement pads CMPAD1 and CMPAD2. Each of the high voltage measurement pads may be shared by an arbitrary number of high voltage switch units. In particular, the high voltage measurement pads CMPAD1 and CMPAD2 may be shared by a different number of switch units. For example, two measurement units SWITCH UNIT1 and SWITCH UNIT2 may be connected the first high voltage measurement pad CMPAD1 and three high voltage measurement units SWITCH UNIT3 through SWITCH UNIT5 may be connected to the second high voltage measurement pad CMPAD2. Although not shown, the high voltage measurement pads CMPAD1 and CMPAD2 may be shared by the same number of high voltage switch units. Other operation and structure of the high voltage switch units can be the same as described above, and thus a detailed explanation thereof will not be given.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit device, comprising:
a plurality of operational circuits that are configured to operate from a plurality of power supply voltages and from a plurality of high voltages that are generated in the integrated circuit device from the plurality of power supply voltages; and
a circuit for measuring the plurality of high voltages, the circuit comprising:
a common high voltage measurement pad; and
a plurality of high voltage switch units connected to the common high voltage measurement pad, a respective high voltage switch unit configured to transmit a corresponding one of the plurality of high voltages to the common high voltage measurement pad in response to a corresponding enable signal.

2. The device of claim 1, wherein a respective switch unit comprises:
a first switch configured to turn on in response to activation of the corresponding enable signal and to apply the corresponding high voltage to the common high voltage measurement pad; and
a second switch configured to reduce leakage current that flows through the first switch during an off period of the first switch.

3. The device of claim 2, wherein the first switch and the second switch are serially connected between the corresponding high voltage and the common high voltage measurement pad.

4. The device of claim 3, wherein the first switch is a p-channel metal oxide semiconductor (PMOS) transistor gated by an inverted signal of the enable signal.

5. The device of claim 3, wherein the second switch is a depletion transistor gated by the high voltage.

6. The device of claim 4, wherein the second switch is a depletion transistor gated by the high voltage.

7. The device of claim 2, wherein the switching unit comprises a plurality of second switches.

8. The device of claim 7, wherein the plurality of second switches comprise a first-second switch and a second-second switch, the first switch, the first-second switch and the second-second switch being serially connected between the corresponding high voltage and the common high voltage measurement pad.

9. The device of claim 8, wherein the first switch is a PMOS transistor gated by an inverted signal of the enable signal.

10. The device of claim 8, wherein each of the first-second switch and the second-second switch is a depletion transistor gated by the high voltage.

11. The device of claim 10, wherein the second-second switch has a channel length greater than that of the first-second switch.

12. The device of claim 10, wherein the second-second switch has a channel length twice as large as the first-second switch.

13. The device of claim 2, wherein a respective high voltage switch unit further comprises a control unit configured to apply a corresponding high voltage to a gate of a corresponding second switch in response to the activation of the corresponding enable signal.

14. The device of claim 1, wherein the plurality of high voltage switch units receive input high voltages of different levels.

15. The device of claim 1, further comprising a plurality of common high voltage measurement pads.

16. The device of claim 15, wherein the plurality of high voltage measurement pads are shared by an arbitrary number of high voltage switch units, by the same number of high voltage switch units and/or by a different number of high voltage switch units.

17. A device of claim 1, wherein the operational circuits comprise non-volatile memory cells.

18. A device of claim 2, wherein the second switch is configured to prevent leakage current from flowing through the first switch during the off period of the first switch.

19. A device of claim 1, wherein the plurality of high voltage switch units are further configured to transmit a corresponding one of the plurality of high voltages to the common high voltage measurement pad in response to a corresponding enable signal at a given one of the high voltage switch units and to isolate remaining high voltages of remaining ones of the high voltages switch units from the common high voltage measurement pad.

20. A method of measuring a plurality of high voltages in an integrated circuit device that includes a plurality of operational circuits that are configured to operate from a plurality of power supply voltages and from the plurality of high voltages that are generated in the integrated circuit device from the plurality of power supply voltages, the method of measuring comprising:

transmitting a corresponding one of the plurality of high voltages to a common high voltage measurement pad in response to a corresponding enable signal.

* * * * *